United States Patent
Cho et al.

(10) Patent No.: US 7,015,994 B2
(45) Date of Patent: Mar. 21, 2006

(54) LIQUID CRYSTAL DISPLAY HAVING GREEN TFT IN BLUE PIXEL REGION

(75) Inventors: Yong Jin Cho, Seoul (KR); Jung Il Lee, Seoul (KR); Min Joo Kim, Seoul (KR); See Hwa Jeong, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 62 days.

(21) Appl. No.: 10/734,173

(22) Filed: Dec. 15, 2003

(65) Prior Publication Data

US 2004/0135149 A1 Jul. 15, 2004

(30) Foreign Application Priority Data

Dec. 31, 2002 (KR) ............... 10-2002-0088110

(51) Int. Cl.
*G02F 1/1368* (2006.01)
*G02F 1/1343* (2006.01)

(52) U.S. Cl. ............ 349/109; 349/38; 349/42; 349/48; 349/54; 349/146

(58) Field of Classification Search ........... 349/41–48, 349/109, 54, 55, 146, 38
See application file for complete search history.

(56) References Cited

U.S. PATENT DOCUMENTS

| 4,855,724 | A | * | 8/1989 | Yang | 345/88 |
| 5,400,157 | A | * | 3/1995 | Won | 349/152 |
| 5,694,185 | A | * | 12/1997 | Oh | 349/46 |
| 6,307,216 | B1 | * | 10/2001 | Huh et al. | 257/59 |
| 6,496,238 | B1 | * | 12/2002 | Greene et al. | 349/73 |
| 6,760,081 | B1 | * | 7/2004 | Takagi | 349/38 |

* cited by examiner

Primary Examiner—Andrew Schechter (57) ABSTRACT

A thin film transistor liquid crystal display is designed such that TFTs for driving green pixels are formed in the blue pixel regions. This improves the overall brightness of the liquid crystal display based on the human view-sensitive characteristics.

26 Claims, 6 Drawing Sheets

LIQUID CRYSTAL DISPLAY HAVING GREEN TFT IN BLUE PIXEL REGION

The present application claims, under 35 U.S.C. § 119, the priority benefit of Korean Patent Application No. 10-2002-0088110 filed Dec. 31, 2002, the entire contents of which are herein fully incorporated by reference.

BACKGROUND OF THE INVENTION

1. Field of the Invention

The present invention relates to a thin film transistor liquid crystal display (TFT LCD), and more particularly, to a TFT LCD that is improved in its brightness by varying the locations of TFTs.

2. Description of the Related Art

In general, a cathode ray tube (CRT) has been one of the most popular display devices. But it is becoming inconvenient to use it because of its large size and heavy weight characteristics compared with its display area.

Accordingly, a thin flat panel display has been developed, which can be installed and used anywhere owing to its slimness characteristic despite its large display area. The thin flat panel display is being substituted for the CRT. In this regard, a liquid crystal display (LCD) has a more excellent resolution than other display devices and a response speed as fast as the CRT in displaying a moving picture.

As is well known to those skilled to the art, the operation principle of the LCD is based on the optical anisotropy and polarization property of liquid crystal molecules. Since each liquid crystal molecule has a thin and long structure, it is possible to control the alignment of the liquid crystal molecules having certain orientation and polarization properties by artificially applying an electromagnetic field.

By properly adjusting the orientations of the liquid crystal molecules, it becomes possible for the liquid crystal molecules to allow light to transmit or to be shielded by using their optical anisotropic characteristic, thereby realizing the colors and image.

Generally, in the liquid crystal display, a first substrate (or a thin film transistor substrate) and a second substrate (or a color filter substrate) are provided to face each other with a predetermined interval therebetween.

Describing in more detail, formed on an inner surface of the TFT array substrate are a plurality of gate lines and a plurality of data lines that are arranged crossing perpendicularly with each other to define a matrix configuration.

Formed on respective crossing points of the gate lines and the data lines are TFTs that function as switching elements. Square pixel electrodes coupled to respective drain electrodes of the TFTs are formed on respective regions defined by gate bus lines and data bus lines. Formed on an inner surface of the color filter substrate facing the TFT array substrate are a black matrix (BM) layer, color filters, and a common electrode.

When a voltage is applied to the gate and data lines, the TFTs formed on the crossing points of the gate and data lines to which the voltage is applied are turned on to accumulate electric charges on the pixel electrodes connected to the drain electrodes of the TFTs that are turned on, thereby varying the orientation of corresponding liquid crystal molecules between the pixel electrodes on which the electric charges are accumulated and the common electrode.

Figure 1:
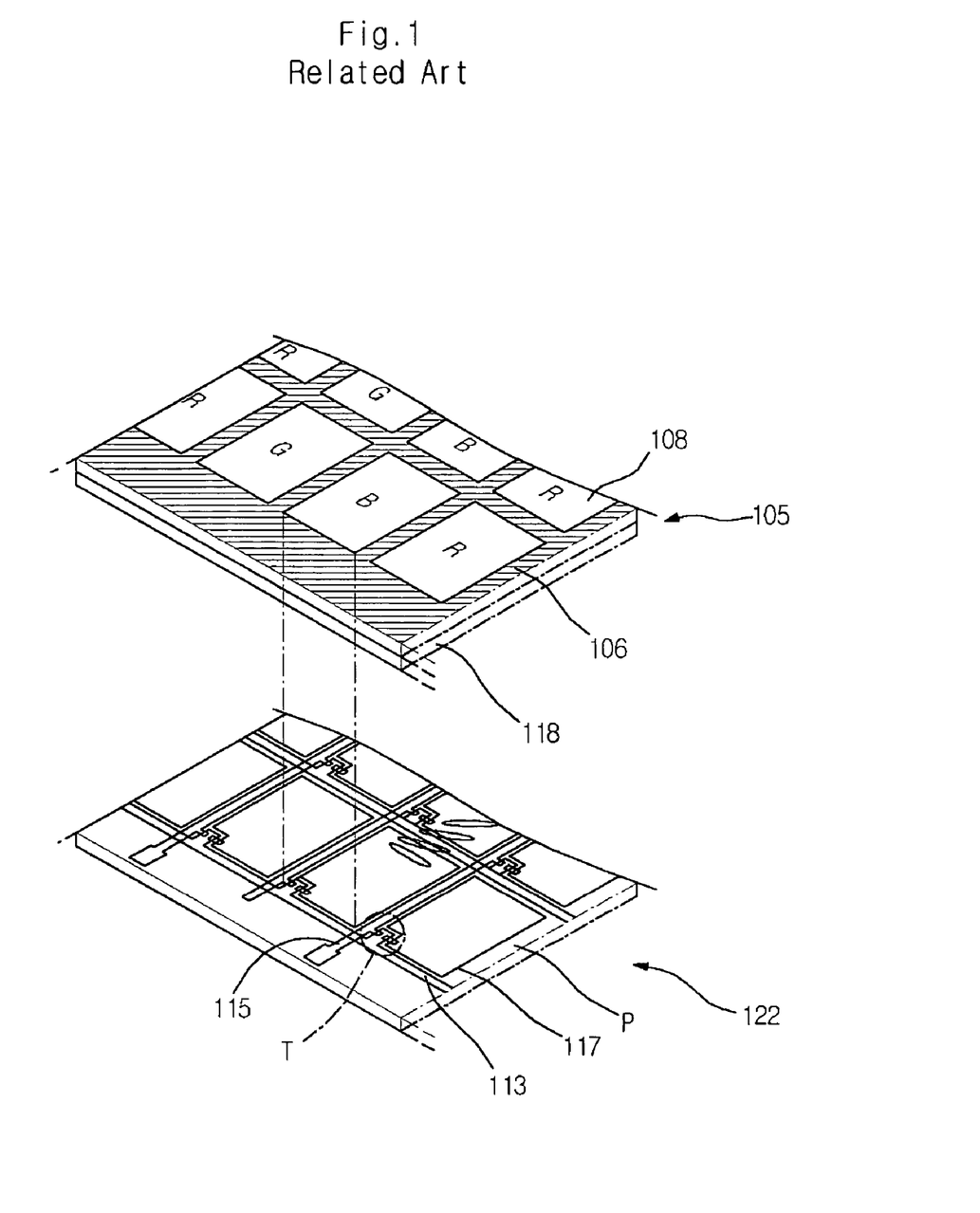
FIG. 1 is an exploded perspective view of a general TFT LCD.

FIG. 1 is a perspective view of a related art TFT LCD.

As shown in FIG. 1, the related art TFT LCD includes an upper substrate 105 with a black matrix layer 106 and a color filter layer 108, and a transparent common electrode 118 formed on the black matrix layer 106 and the color filter layer 108; and a lower substrate 122 having pixel regions P on which pixel electrodes 117 are formed and on which a TFT array including a plurality of switching elements T (TFTs) is formed. A liquid crystal layer is formed in a space defined between the upper and lower substrates 105 and 122.

The upper substrate 122 is a TFT array substrate on which TFTs are arranged in a matrix configuration. The TFTs are disposed on respective crossing regions where gate lines 113 intersect data lines 115. The pixel regions P are defined by the intersection of the gate lines 113 and the data lines 115. The pixel electrodes 117 formed on the respective pixel regions P are formed of a conductive metal such as indium-tin-oxide (ITO) having high light transmissivity.

The orientation of the liquid crystal layer on the pixel electrodes 117 is determined by a direction of electric field applied from the TFTs. The light transmission through the liquid crystal layer is adjusted in accordance with the orientation extent of the liquid crystal layer to display a desired image.

Figure 2:
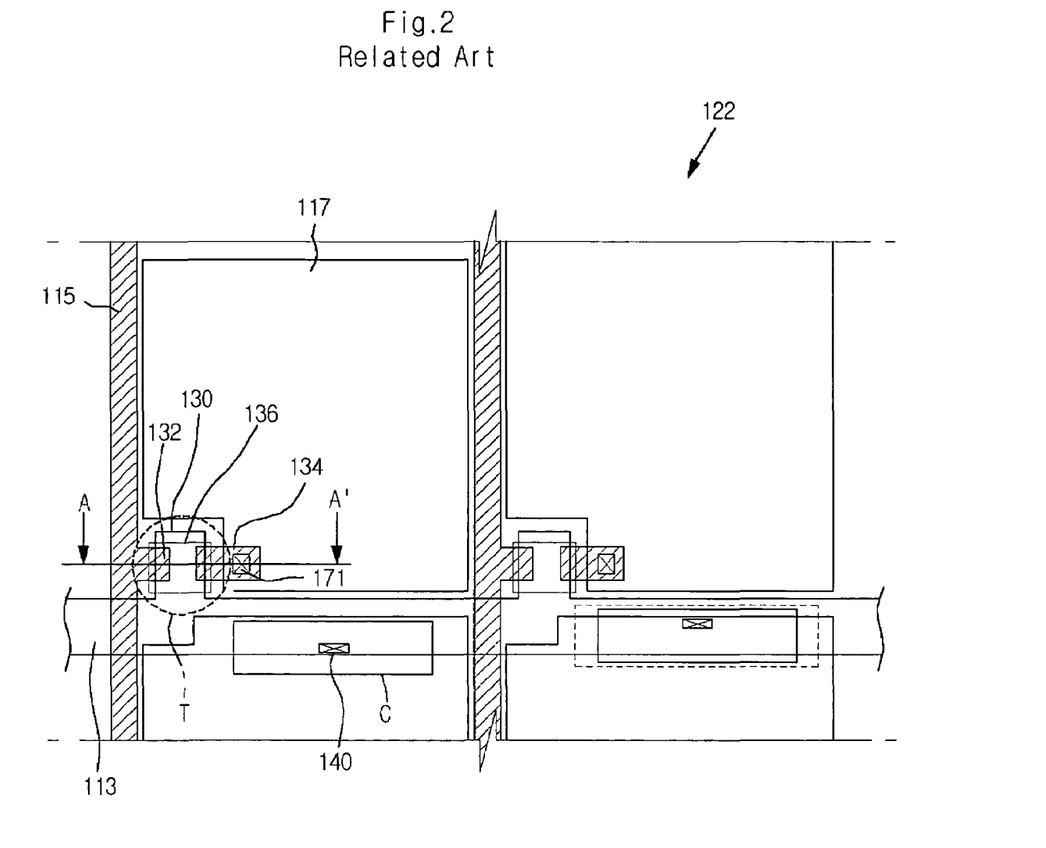
FIG. 2 is an enlarged plan view of the TFT array substrate of FIG. 1.
Figure 3:
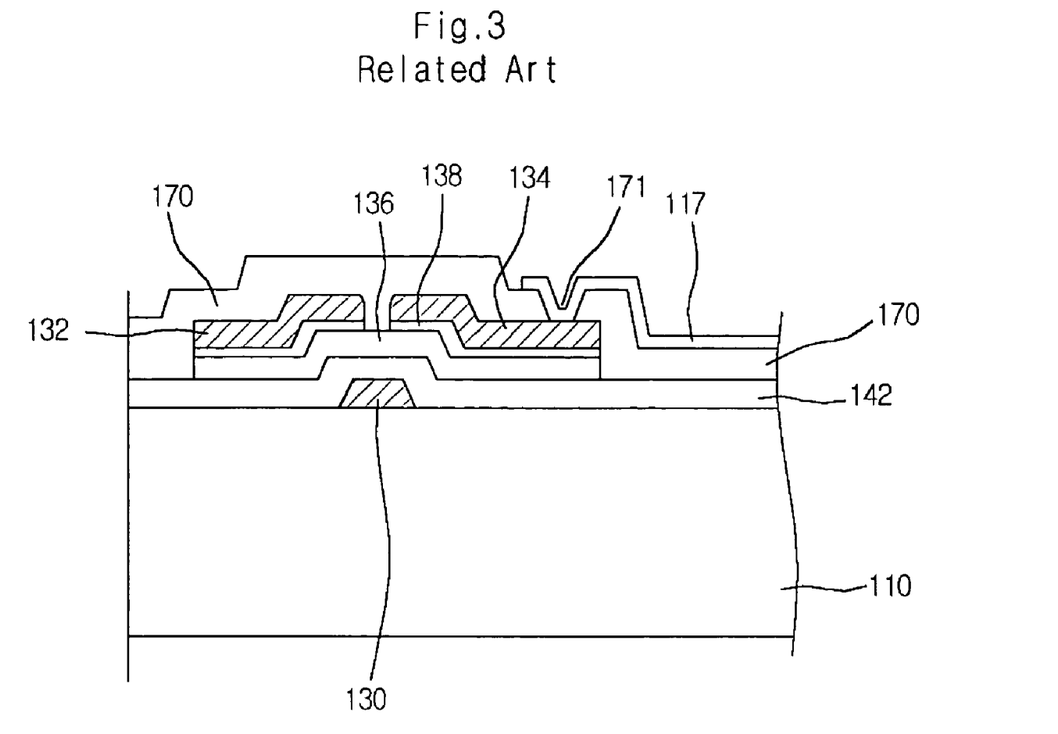
FIG. 3 is a sectional view taken along line A–A' of FIG. 2.

FIG. 2 shows an enlarged view of a TFT array substrate of the related art TFT LCD in FIG. 1, and FIG. 3 shows a sectional view taken along the line A–A' of FIG. 2.

As shown in FIGS. 2 and 3, formed on the TFT array substrate 122 is a transparent insulating layer 110 on which the gate lines 113 and gate electrodes 130 extending from the respective gate lines 113 are formed. The gate lines 113 and the gate electrodes 130 are formed of a conductive material such as metal.

A gate insulating layer 142 is deposited on the transparent insulating layer 110 including the gate lines 113 and the gate electrodes 130. On the gate insulating layer 142, an active layer 136 and an ohmic contact layer 138 are sequentially formed.

Formed on the ohmic contact layer 138 are the data lines 115 perpendicularly crossing the gate lines 113, source electrodes 132 extending from the data lines 115, drain electrodes facing the respective source electrode 132 based on the respective gate electrodes 130, and capacity electrodes C overlapped with the drain and gate lines 134 and 113.

In addition, all of the data lines 115, the source and drain electrodes 132 and 134 and the capacity electrodes C are covered with a passivation layer 170. The passivation layer 170 is provided with contact holes 171 and 140 through which the drain electrodes 134 and the capacity electrodes C are exposed, respectively.

The pixel electrodes 117 are formed on portions of the passivation layer 170, which correspond to the pixel regions defined by the intersections of the gate lines 113 and the data lines 115. The pixel electrodes 117 are connected to the drain electrodes 134 and the capacity electrodes C through the contact holes 171.

Describing the operation of the above-described TFT array substrate, when a voltage is applied to the gate electrodes 130 through the gate lines 113, electrons are collected on the active layer 136 to define a conductive channel, thereby allowing current to flow between the sources and drain electrodes 132 and 134. At this point, image signals transmitted to the data lines 115 reach the pixel electrodes 117 through the source and drain electrodes 132 and 134.

The above-described liquid crystal display uses a backlight as a light source, which is disposed on a rear side of the TFT array substrate. The light radiated from the backlight is attenuated while passing through the LCD. That is, only 3–8% of the incident light passes through the LCD, deteriorating the brightness of the screen.

To solve this problem, a method for improving the brightness of the screen by increasing the brightness of the backlight has been proposed. However, this method is not preferable because it increases the electric power consumption for the LCD significantly.

Therefore, in order to improve the brightness of the screen without increasing the electric power consumption, a method for enlarging an apparatus ratio of a liquid crystal panel by increasing an area occupied by the pixel regions has been also proposed. To increase the area of the pixel regions, there is a need to reduce a width of the data line and a gap between the pixel electrodes.

However, when the gap between the pixel electrodes is reduced, the distance between the pixel electrode and the data line is also reduced. As a result, a coupling phenomenon is incurred by electric attraction between them, thereby deteriorating the drive of the TFTs.

A method for improving the brightness of the LCD by using an optical film has also been developed. However, an additional process for forming the optical film is further required which increases the manufacturing cost of the LCD.

SUMMARY OF THE INVENTION

Accordingly, the present invention is directed to a TFT LCD that substantially obviates one or more problems due to limitations and disadvantages of the related art.

An object of the present invention is to provide a TFT LCD with the improved brightness. The improvement of the brightness is realized by using a principle that red, green, and blue pixel regions have different view-sensitive characteristics from each other. That is, the green pixel region has the highest/best view-sensitive characteristic, while the blue pixel region has the worst view-sensitive characteristic.

Another object of the present invention is to provide a TFT LCD in which a green pixel region having the highest view-sensitive characteristic is maximized.

Still another object of the present invention is to provide a TFT LCD, which is further improved in its brightness by forming switching elements of the green pixel region on the blue pixel region having the worst view-sensitive characteristic.

To achieve these objects and other advantages and in accordance with the purpose of the invention, as embodied and broadly described herein, there is provided a TFT LCD. The TFT LCD includes a first substrate including a color filter having red, green, and blue filters and a black matrix disposed between the red, green, and blue filters; a second substrate having red, green, and blue pixel regions respectively having red, green, and blue pixel electrodes, TFTs for applying electric signals to the pixel electrodes, gate and data lines connected to the TFTs and formed between the pixel regions, wherein TFTs for driving the green pixel electrodes are formed in the blue pixel regions; and a liquid crystal layer disposed between the first and second substrates.

According to another aspect, the present invention provides a structure for a liquid crystal display, comprising plural pixel regions; and plural thin film transistors (TFTs) for driving the pixel regions, wherein the pixel regions include blue, green and red pixel regions, and TFTs for driving green pixel electrodes are formed on a portion of the blue pixel regions.

According to still another aspect, the present invention provides a thin film transistor liquid crystal display comprising red, green and blue pixel regions; TFTs (thin film transistors) for driving blue pixel electrodes and TFTs for driving green pixel electrodes, all of which are formed in the blue pixel regions; a TFT array substrate including the TFTs for driving the green pixel electrode and an electrode lead line for connecting the green pixel electrodes to the TFTs for driving the green pixel electrodes; a color filter substrate; and a liquid crystal layer disposed between the TFT array substrate and the color filter substrate.

According to another aspect of present invention, a display device structure includes a first substrate including a first color filter, a second color filter and a third color filter; and a second substrate including a first pixel region, a second pixel region and third pixel region corresponding respectively to the first, second, and third color filters, a first switching device for driving the first pixel region, and a second switching device for driving the second pixel region, wherein the first and second switching devices are provided in the first pixel region.

In the present invention, as the TFTs for the driving the green pixel electrodes are provided in the blue pixel regions, the area of the green pixel regions having the best view-sensitive characteristic is maximized, while the area of the blue pixel regions having the worst view-sensitive characteristic is minimized. As a result, the overall brightness of the LCD can be improved.

Furthermore, since the brightness improvement is realized by simply changing a design of only the blue pixel regions, an additional process is not required, thereby not increasing the manufacturing costs of the LCD.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this application, illustrate embodiment(s) of the present invention and together with the description serve to explain the principle of the present invention. In the drawings.

DETAILED DESCRIPTION OF THE PREFERRED EMBODIMENTS

Reference will now be made in detail to a preferred embodiments of the present invention with reference to the accompanying drawings.

Figure 4:
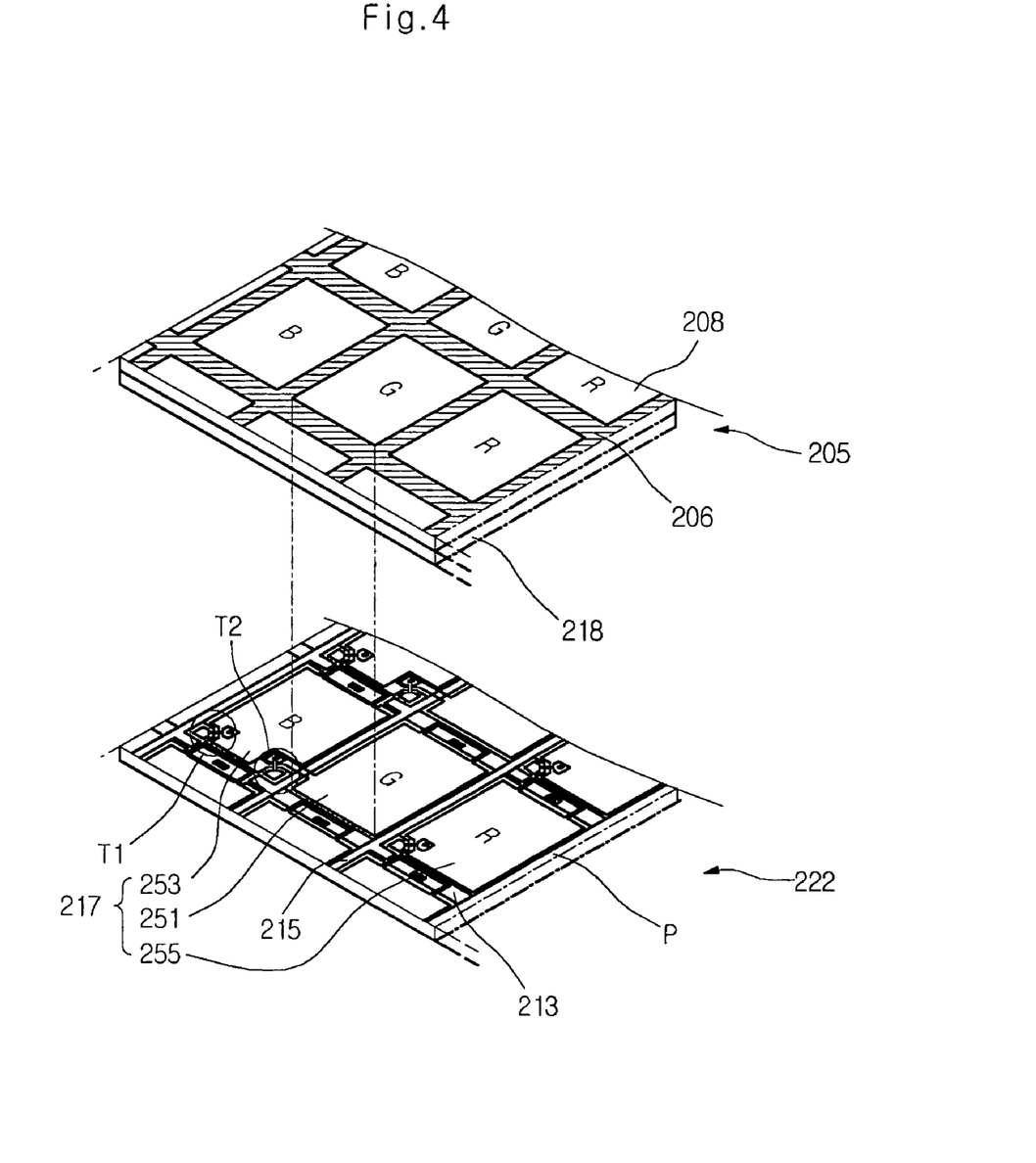
FIG. 4 is an exploded perspective view of a TFT LCD according to a preferred embodiment of the present invention.

FIG. 4 shows an exploded perspective view of a TFT LCD according to a preferred embodiment of the present invention.

As shown in FIG. 4, the inventive TFT LCD includes an upper substrate 205 having a black matrix layer 206, a color filter layer 208 and a transparent common electrode 218 formed on the black matrix 206 and the color filter layer 208; and a lower substrate 222 having pixel regions P on which pixel electrodes 217 are formed and on which a TFT array including a plurality of switching elements T (TFTs) is formed. A liquid crystal layer is formed in a space defined between the upper and lower substrates 205 and 222.

The upper substrate 222 is a TFT array substrate on which TFTs are arranged in a matrix configuration. The TFTs are disposed on respective crossing regions where gate lines 213 intersect data lines 215.

Pixel regions P are defined by the respective intersections of the gate lines 213 and the data lines 215. The pixel electrodes 217 formed on the respective pixel regions P are formed of a conductive metal such as indium-tin-oxide (ITO) having high light transmissivity.

The pixel regions P include red pixel regions, green pixel regions, and blue pixel regions that are alternately arranged, and red, green and blue pixel electrodes 255, 251, and 253 formed respectively in the red, green, and blue pixel regions.

The color filter layer 208 includes red, green, and blue color filters arranged corresponding to the red, green, and blue pixel regions. The color filter layer 208 is formed through a pigment dispersion method, a dyeing method, or an electrodeposition method.

Generally, it has been noted that human eyes have the worst color recognition intensity with respect to the blue color, and the highest color recognition intensity with respect to the green color. Therefore, even when the color intensity of the blue color is lowered compared with other colors, the human eyes recognize the images as a normal image.

Accordingly, it is possible to improve the overall brightness of the LCD by maximizing the area of the green pixel regions and minimizing the area of the blue pixel regions.

The present invention has been made in an effort to improve the brightness of the LCD by using the above features. That is, in the present invention, TFTs T2 for driving the green pixel electrodes are not formed in the green pixel regions, but are formed in the blue pixel regions. In this regard, the green pixels are formed adjacent to data lines on which TFTs T1 for driving blue pixel electrodes are not formed.

Figure 5:
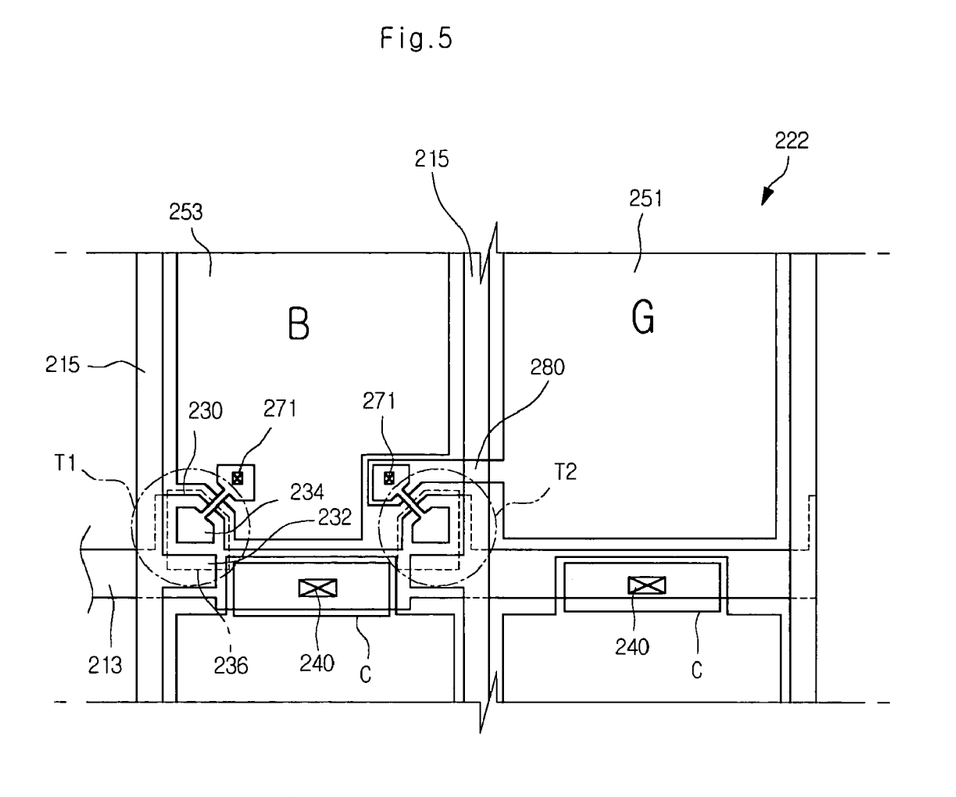
FIG. 5 is an enlarged plan view of the TFT array substrate with an L-shape channel in the TFT LCD of FIG. 4 according to the preferred embodiment of the present invention.
Figure 5A:
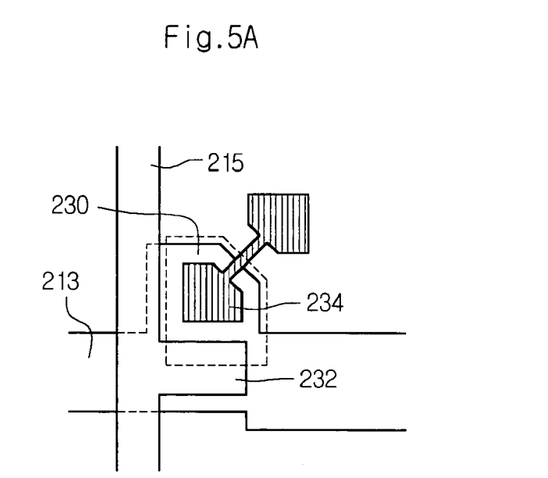
FIG. 5A is an exploded view of a TFT of FIG. 5.

FIG. 5 shows an example of an enlarged view of the TFT array substrate of FIG. 4 in which an L-shape channel (for each TFT) is formed in accordance with the spirit of the present invention. FIG. 5A shows an exploded top plan view of a TFT T1 of FIG. 5 for better understanding. Although FIG. 5A shows the exploded view of the TFT T1 in FIG. 5, a TFT T2 in FIG. 5 is a flipped (symmetrical) version of the TFT T1 of FIGS. 5 and 5A.

As shown in FIGS. 5 and 5A, the gate lines 213 formed of a conductive material such as metal are formed on the TFT array substrate 222. Extending from the gate lines 213 are gate electrodes 230.

As a feature of the invention, the TFTs T1 for driving the blue pixel electrodes 253 and the TFTs T2 for driving the green pixel electrodes 251 are formed together in the blue pixel regions. As a result, an area of the green pixel electrodes 251 is relatively increased (or maximized) while an area of the blue pixel electrodes 253 is relatively reduced, which improves the overall brightness of the LCD significantly without introducing the problems of the related art.

Although not shown specifically in FIG. 5, the gate lines 213 and the gate electrodes 230 are covered with a gate insulating layer formed of a material such as silicon nitride or a silicon oxide. On the gate insulating layer, an active layer 236 and an ohmic contact layer are deposited, in that order.

Each blue pixel region of the LCD includes the blue pixel electrode 253 contacting the respective drain electrode 234. Capacity electrodes defining a parallel circuit with the pixel electrodes 217 are formed on the gate lines 213.

Meanwhile, since the TFTs T2 for driving the green pixel electrodes 251 are formed in the blue pixel regions, electrode lead lines 280 are formed extending from the green pixel electrodes 251 to the respective adjacent blue pixel regions. Therefore, the area size of each blue pixel electrode is further reduced according to or by as much as the area size occupied by the TFTs T2 for driving the green pixel electrodes. The TFTs T1 and T2 are symmetrically disposed on the opposite end portions of the blue pixel regions.

In the above structure, there are provided first and second contact holes 271 and 240 for exposing the drain electrodes 234 contacting the pixel electrodes 217 and exposing the capacity electrodes C contacting the gate lines 213, respectively.

At this point, the capacity electrodes C formed on the gate lines 213 associated with the blue pixel regions have a reduced storage space compared with other capacity electrodes associated with the green/red pixel regions due to the TFTs for driving the green pixel electrodes, which are formed in the blue pixel regions. This reduced storage space can be compensated for by increasing the widths of the gate lines 213 adjacent to the blue pixel regions as shown in FIG. 5, thereby proving desire capacitance.

In addition, each of the TFTs T2 formed in the blue pixel regions, for driving the green pixel electrodes 251 includes elements such as gate electrode, source electrode, drain electrode, active layer, ohmic contact layer and the like. In the TFTs T2, the gate lines 213 on the ohmic contact layers are arranged to cross perpendicularly with the data lines 215, and source electrodes 232 for the green pixel electrodes 251 are extended from the data lines 215 to the blue pixel regions. Electrode lead lines extended from the green pixel electrodes 251 are overlapped with the data lines 215 associated with the green pixel electrodes 251. Capacity electrodes C associated with the blue pixel regions are overlapped with the gate lines 213 and the drain electrodes 234 contacting the blue pixel regions. In addition, the capacities of the pixel regions may be identical to each other.

In summary, the blue pixel electrodes 253 are essentially formed in the blue pixel regions defined by the intersection of the gate lines 213 for driving the blue pixel electrodes 253 and the data lines 215. In addition, the green pixel electrodes 251 formed in the green pixel regions are extended by the lead lines 280 to a portion of the adjacent blue pixel regions where the TFTs T2 for driving the green pixel electrodes 251 are formed. As a result, as the TFTs T2 for driving the green pixel electrodes 251 are further formed in the adjacent blue pixel regions, the aperture ratio of the green pixels (green pixel electrodes) having the highest view-sensitive characteristic is increased, while the aperture ratio of the blue pixels having the worst view-sensitive characteristic is reduced, thereby improving the view-sensitive characteristic with respect to the overall brightness of the LCD.

The TFTs for driving the green pixel electrodes should be formed in the blue pixel regions to an extent not to deteriorate the color sense. In addition, as shown in FIG. 5, the TFTs T2 for diving the green pixel electrodes 251 are disposed facing the TFTs T1 for driving the blue pixel electrodes 253. However, the present invention is not limited to this configuration and encompasses other variations. For instance, the TFTs T2 may be disposed adjacent to the intersecting points of the gate lines 213 and the data lines 215 while the lead lines are extended to the green pixel electrodes 251.

The TFT array substrate 222 described above is designed to allow the current to flow between the source and drain electrodes 232 and 234 by forming a conductive channel, and concentrating electrons on the active layer when a voltage is applied to the gate electrodes 230 through the gate lines 213. As a result, the image signals transmitted to the date lines 215 reach the pixel electrodes 251, 253 and 255 through the source and drain electrodes 232 and 234. At this point, as the area of the green pixel regions is enlarged, the overall brightness of the LCD can be improved.

Meanwhile, as shown in the drawings, the L-shaped channel of the TFTs allows the electrode lead lines 280 to be easily formed.

Figure 6:
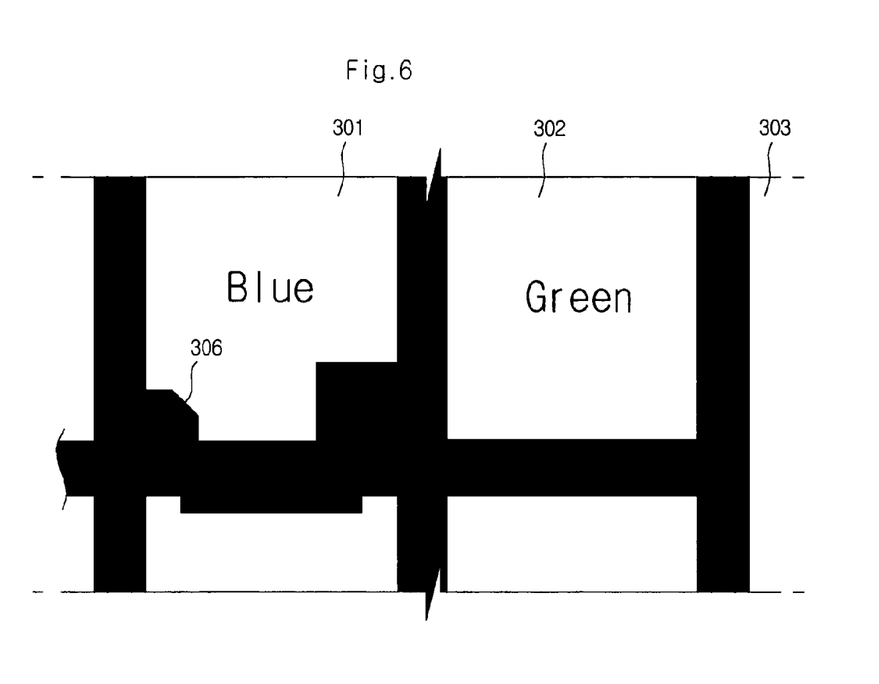
FIG. 6 is a partial plan view of a color filter of the TFT LCD according to the preferred embodiment of the present invention.

FIG. 6 shows a color filter substrate of the present invention. This configuration is usable in conjunction with the TFT array substrate of FIG. 5.

As shown in FIG. 6, a black matrix 306 having an opening corresponding to the pixel regions is formed on a transparent insulating substrate. A color filter composed of red, green, and blue color filters 303, 302, and 301 is formed on the black matrix 306. Peripheries of the color filter are overlapped with the black matrix 306. The red, green, and blue color filters 303, 302, and 301 are disposed corresponding to the respective red, green, and blue pixel electrodes 255, 251, and 253 and the color is realized by the combination of the three color filters.

Here, the blue color filter 301 corresponding to the blue pixel electrode is designed to be identical in its size to the blue pixel electrode. That is, the size of the blue color filter 301 is reduced by as much as an area occupied by the green pixel electrodes, while making the green color filter 302 to have the maximized area.

In the present invention, as the TFTs for the driving the green pixel electrodes are further extended to the blue pixel regions, the area of the green pixel regions having the best view-sensitive characteristic is maximized, while the area of the blue pixel regions having the worst view-sensitive characteristic is minimized. As a result, the overall brightness of the LCD is improved greatly.

Furthermore, since the brightness improvement is realized by simply changing a design of only the blue pixel regions, an additional process is not required, thereby reducing or not increasing the manufacturing cost of the LCD.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A thin film transistor liquid crystal display comprising:
    a first substrate including a color filter having red, green, and blue filters;
    a second substrate having red, green, and blue pixel regions respectively having red, green, and blue pixel electrodes, thin film transistors (TFTs) for applying electric signals to the pixel electrodes, gate and data lines connected to the TFTs and formed between the pixel regions, wherein TFTs for driving the green pixel electrodes and TFTs for driving the blue pixel electrodes are formed in the blue pixel regions; and
    a liquid crystal layer disposed between the first and second substrates.

2. The thin film transistor liquid crystal display according to claim 1, wherein the red, green, and blue filters respectively correspond to the red, green, and blue pixel regions.

3. The thin film transistor liquid crystal display according to claim 1, further comprising:
    electrode lead lines extending from the green pixel electrodes to the TFTs formed in the blue pixel regions for driving the green pixel electrodes.

4. The thin film transistor liquid crystal display according to claim 1, wherein the red, green, and blue pixel regions have an identical capacity to each other.

5. The thin film transistor liquid crystal display according to claim 1, wherein a width of the gate lines adjacent to the blue pixel regions is greater than that of the gate lines adjacent to other pixel regions.

6. The thin film transistor liquid crystal display according to claim 1, wherein each of the TFTs is formed to define an L-shaped channel between a respective source electrode and a respective drain electrode.

7. The thin film transistor liquid crystal display according to claim 1, wherein the TFTs for driving the green pixel electrodes are disposed adjacent to intersecting points of the gate lines and the data lines.

8. A structure for a liquid crystal display, comprising:
    plural pixel regions; and
    plural thin film transistors (TFTs) for driving the pixel regions,
    wherein the pixel regions include first-color, second-color and third-color pixel regions, and TFTs for driving first-color pixel electrodes and TFTs for driving second-color pixel electrodes are formed in the second-color pixel regions.

9. The structure according to claim 8, wherein the pixel regions have an identical capacity to each other.

10. The structure according to claim 8, wherein each of the TFTs is formed to define an L-shaped channel.

11. The structure according to claim 8, wherein the first, second and third colors are green, blue and red, respectively.

12. A thin film transistor liquid crystal display comprising:
    red, green and blue pixel regions;
    TFTs (thin film transistors) for driving blue pixel electrodes and TFTs for driving green pixel electrodes, all of which are formed in the blue pixel regions;
    a TFT array substrate including the TFTs for driving the green pixel electrode and an electrode lead line for connecting the green pixel electrodes to the TFTs for driving the green pixel electrodes;
    a color filter substrate; and
    a liquid crystal layer disposed between the TFT array substrate and the color filter substrate.

13. The thin film transistor liquid crystal display according to claim 12, wherein the TFTs for driving the green pixel electrodes are formed between the pixel electrodes.

14. The thin film transistor liquid crystal display according to claim 13, wherein each of the TFTs is formed to define an L-shaped channel so that the electrode lead line can be easily formed.

15. A display device structure comprising:
    a first substrate including a first color filter, a second color filter and a third color filter; and a second substrate including, a first pixel region, a second pixel region and a third pixel region corresponding respectively to the first, second, and third color filters, a first switching device for driving the first pixel region, and a second switching device for driving the second pixel region, wherein the first and second switching devices are provided in the first pixel region.

16. The display device structure according to claim 15, wherein the first pixel region is a pixel region corresponding to the first color filter being a blue color filter.

17. The display device structure according to claim 15, wherein the first and second switching devices are thin film transistors (TFTs) for driving pixel electrodes in the first and second pixel regions being blue and green pixel regions, respectively.

18. The display device structure according to claim 15, further comprising: a lead line extending from a pixel electrode in the second pixel region to the second switching device in the first pixel region.

19. The display device structure according to claim 15, wherein the first and second switching devices are thin film transistors (TFTs), each of the TFTs including a gate electrode, a source electrode, a drain electrode, and an L-shaped channel formed by and between the source and drain electrodes.

20. The display device structure according claim 15, wherein the first switching device is symmetrically located with respect to the second switching device.

21. A liquid crystal display device comprising:

first and second substrates, and a liquid crystal layer between the first and second substrates; and a plurality of pixel regions at one of the first and second substrates, each pixel region having a single pixel electrode, wherein one of the pixel regions includes two thin film transistors (TFTs) for driving two pixel electrodes, respectively.

22. The structure according to claim 21, further comprising:

electrode lead lines extending from the green pixel electrodes in the green pixel regions to the blue pixel regions.

23. The liquid crystal display device according to claim 21, wherein the one pixel region including the two TFTs is a blue pixel region.

24. The liquid crystal display device according to claim 21, wherein another one of the pixel regions includes no TFT.

25. The liquid crystal display device according to claim 24, wherein the another pixel region including no TFT is a green pixel region.

26. A structure for a liquid crystal display, comprising:

plural pixel regions;

plural thin film transistors (TFTs) for driving the pixel regions;

wherein the pixel regions include blue, green and red pixel regions, and TFTs for driving green pixel electrodes are formed on a portion of the blue pixel regions; and gate lines and date lines crossing each other, wherein a width of the gate lines adjacent to the blue pixel regions is greater than that of the gate lines adjacent to other pixel regions.

* * * * *